(12) United States Patent
Eom (10) Patent No.: US 8,941,241 B2
(45) Date of Patent: Jan. 27, 2015

(54) SEMICONDUCTOR DEVICE AND METHOD OF MANUFACTURING THE SAME

(75) Inventor: Dae Sung Eom, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 50 days.

(21) Appl. No.: 13/585,240

(22) Filed: Aug. 14, 2012

(65) Prior Publication Data
US 2013/0056884 A1    Mar. 7, 2013

(30) Foreign Application Priority Data

Sep. 6, 2011    (KR) .......................... 10-2011-0089992

(51) Int. Cl.
| | | |
|---|---|---|
| *H01L 23/48* | (2006.01) | |
| *H01L 21/033* | (2006.01) | |
| *H01L 27/02* | (2006.01) | |
| *H01L 21/768* | (2006.01) | |
| *H01L 21/3213* | (2006.01) | |

(52) U.S. Cl.
CPC ........ *H01L 21/0338* (2013.01); *H01L 27/0207* (2013.01); *H01L 21/76838* (2013.01); *H01L 21/0337* (2013.01); *H01L 21/32139* (2013.01)
USPC ........... 257/773; 257/692; 257/695; 257/784; 257/786; 257/E23.02; 257/E23.079

(58) Field of Classification Search
USPC ................. 257/734, 773, 775, 786, E23.142, 257/E23.151, E21.595, 692, 695, 784, 257/E23.015, E23.02, E23.079
See application file for complete search history.

(56) References Cited

U.S. PATENT DOCUMENTS

| | | | | |
|---|---|---|---|---|
| 8,227,354 B2 * | 7/2012 | Kim et al. | ..................... | 438/717 |
| 8,310,055 B2 * | 11/2012 | Park et al. | ..................... | 257/773 |
| 8,541,306 B2 * | 9/2013 | Yang et al. | ..................... | 438/669 |
| 8,617,998 B2 * | 12/2013 | Min et al. | ..................... | 438/717 |
| 8,629,052 B2 * | 1/2014 | Park et al. | ..................... | 438/612 |

FOREIGN PATENT DOCUMENTS

| | | |
|---|---|---|
| KR | 1020090110172 A | 10/2009 |
| KR | 1020100055104 A | 5/2010 |

* cited by examiner

*Primary Examiner* — Jasmine Clark
(74) *Attorney, Agent, or Firm* — William Park & Associates Patent Ltd.

(57) ABSTRACT

A semiconductor device includes at least 4 conductive line groups arranged in parallel over one memory cell block and each configured to include conductive lines. First contact pads may be coupled to the respective ends of the conductive lines of two of the 4 conductive line groups in a first direction, and second contact pads may be coupled to the respective ends of the conductive lines of the remaining 2 of the 4 conductive line groups in a second direction opposite to the first direction.

20 Claims, 10 Drawing Sheets

SEMICONDUCTOR DEVICE AND METHOD OF MANUFACTURING THE SAME

CROSS-REFERENCE TO RELATED APPLICATION

Priority is claimed to Korean patent application number 10-2011-0089992 filed on Sep. 6, 2011, the entire disclosure of which is incorporated by reference.

BACKGROUND

Exemplary embodiments relate generally to a semiconductor device and a method of manufacturing the same and, more particularly, to a semiconductor device including conductive patterns and a method of manufacturing the same.

To highly integrate semiconductor devices, the line widths in a pattern and the spacing widths between patterns are reduced in order to form more patterns in a limited area. The photolithography process has many limitations in forming patterns due to its limited resolution for further reducing the line widths of a pattern and the spacing widths between patterns.

In order to form fine patterns with a fine width greater than the resolution limit of the photolithography process, double patterning technology is used where the fine patterns are formed by overlapping the patterns, and where spacer patterning technology is used for forming the fine patterns.

A semiconductor device includes a plurality of metal lines and a plurality of contact pads coupled to the metal lines. Accordingly, there is a need for a layout scheme for efficiently arranging the plurality of metal lines and the plurality of contact pads in a narrow area.

BRIEF SUMMARY

Exemplary embodiments relate to a semiconductor device in which a plurality of conductive lines and a plurality of contact pads are efficiently arranged and a method of manufacturing the same.

A semiconductor device according to an aspect of the present invention includes at least 4 conductive line groups arranged in parallel over one memory cell block and each configured to include conductive lines. First contact pads may be coupled to the respective ends of the conductive lines of two of the 4 conductive line groups in a first direction, and second contact pads may be coupled to the respective ends of the conductive lines of the remaining 2 of the 4 conductive line groups in a second direction opposite to the first direction.

A semiconductor device according to another aspect of the present invention includes first to eighth conductive line groups arranged in parallel over one memory cell block and each configured to include conductive lines; first contact pads coupled to the respective ends of first, second, fifth, and sixth conductive lines, respectively corresponding to the first, the second, the fifth, and the sixth conductive line groups, in a first direction; and second contact pads coupled to the respective ends of third, fourth, seventh, and eighth conductive lines, respectively corresponding to the third, the fourth, the seventh, and the eighth conductive line groups, in a second direction opposite to the first direction.

A semiconductor device according to yet another aspect of the present invention includes first, second, fifth, and sixth conductive line groups formed over one memory cell block region and over a first contact pad region on one side of the memory cell block region; third, fourth, seventh, and eighth conductive line groups formed over the memory cell block region and over a second contact pad region on the other side of the memory cell block region; first contact pads coupled to the respective ends of first, second, fifth, and sixth conductive lines, included in the first, the second, the fifth, and the sixth conductive line groups, over the first contact pad region; and second contact pads coupled to the respective ends of third, fourth, seventh, and eighth conductive lines, included in the third, the fourth, the seventh, and the eighth conductive line groups, over the second contact pad region. The first, the second, the fifth, and the sixth conductive lines and the third, the fourth, the seventh, and the eighth conductive lines are extended and arranged in opposite directions to adjacent conductive line groups and the first to eighth conductive lines of the first to eighth conductive line groups are extended and arranged in opposite directions to adjacent conductive line groups so that the first contact pads do not overlap with each other and the second contact pads do not overlap with each other.

A method of manufacturing a semiconductor device according to further yet another aspect of the present invention includes forming a conductive layer and a hard mask layer over a semiconductor substrate in which underlying structures are formed; forming a plurality of photoresist patterns in parallel on the hard mask layer, wherein the photoresist patterns are classified into first to eighth groups, the photoresist patterns of the first, the second, the fifth, and the sixth groups are extended in a first direction, and the photoresist patterns of the third, the fourth, the seventh, and the eighth groups are extended in a second direction opposite to the first direction; forming spacers on the sidewalls of the photoresist patterns; removing the photoresist patterns; forming contact masks to surround spacers on regions where contact pads will be formed, from among the spacers extended in the first direction and the second direction; patterning the hard mask layer using the spacers and the contact masks as etch masks; and forming a plurality of conductive lines and the contact pads coupled to the conductive lines by patterning the conductive layer using the patterned hard mask layer.

DESCRIPTION OF EMBODIMENTS

Hereinafter, some exemplary embodiments of the present invention will be described in detail with reference to the accompanying drawings. The figures are provided to allow those having ordinary skill in the art to understand the scope of the various embodiments of the invention.

In an embodiment of the invention, a method of manufacturing a semiconductor device, including source and drain select lines, 2 pass transistor gate lines, and 64 cell gate lines, is described as an example.

Figure 1:
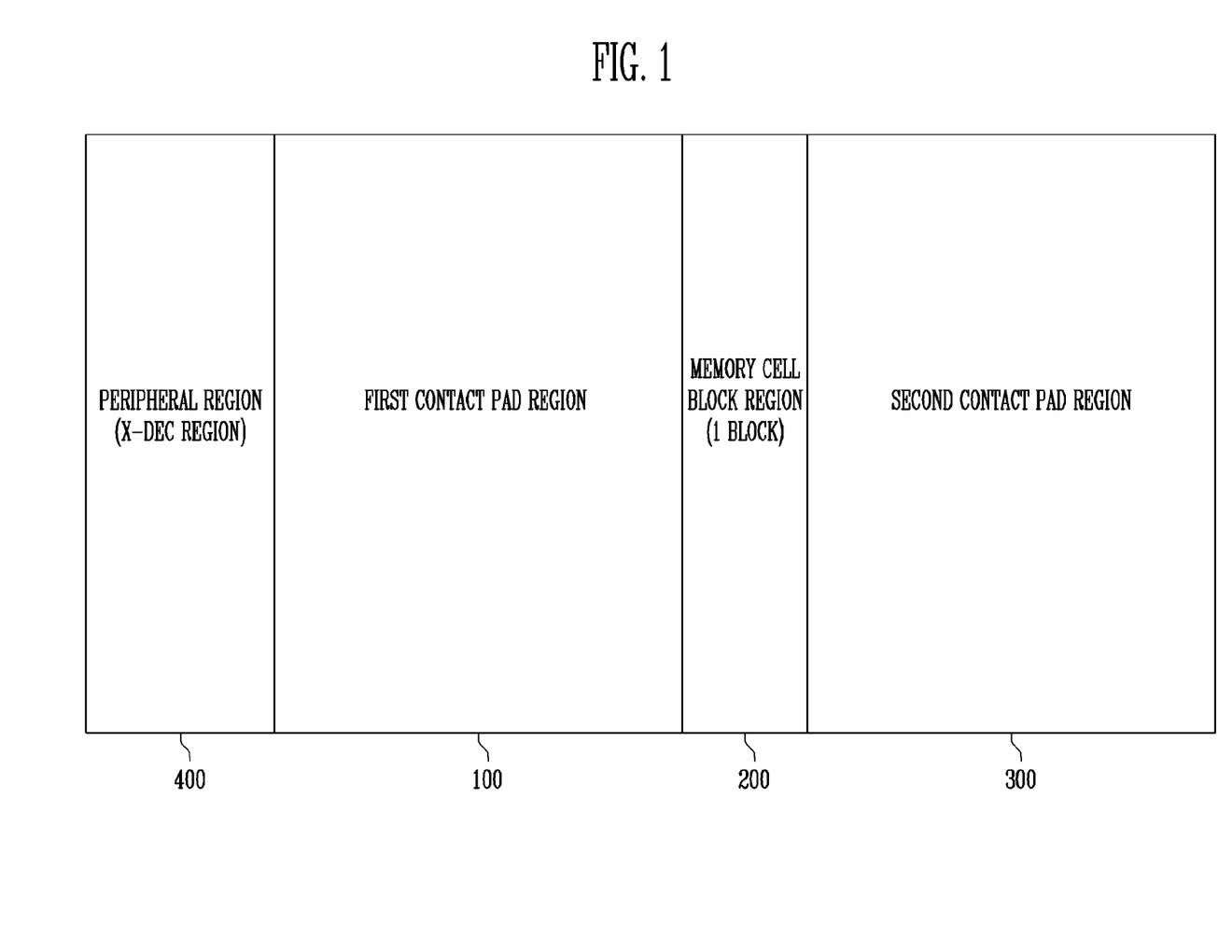
FIG. 1 is a layout diagram of a semiconductor device according to an embodiment of the invention.

FIG. 1 is a layout diagram of a semiconductor device according to an embodiment of the invention. The semiconductor device includes a first contact pad region 100, a memory cell block region 200, a second contact pad region 300, and a peripheral region 400.

The memory cell block region 200 is a region where one memory cell block is formed. The peripheral region 400 may be an X decoder region including pass transistors for coupling the gate lines and the global lines of the memory cell block in the memory cell block region 200.

Figure 2:
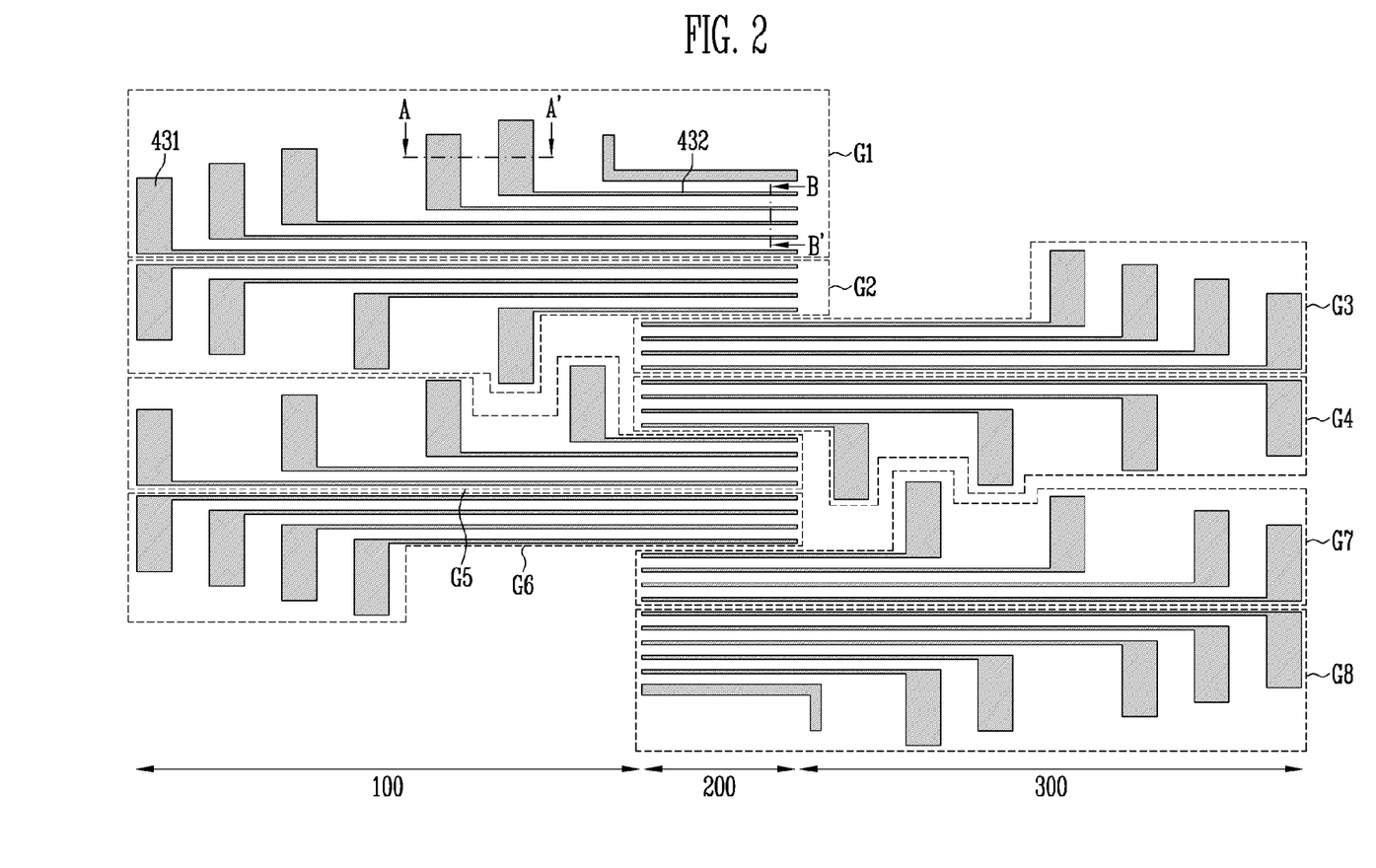
FIGS. 2 to 13 are a plan view and cross-sectional views for illustrating a semiconductor device and a method of manufacturing the same according to an embodiment of the invention.

FIG. 2 is a plan view showing the first contact pad region 100, the memory cell block region 200, and the second contact pad region 300 shown in FIG. 1.

Referring to FIG. 2, first and second photoresist patterns 432 and 431 are formed on a semiconductor substrate, including the memory cell block region 200 and the first and second contact pad regions 100 and 300 placed on both sides of the memory cell block region 200. The first photoresist patterns 432 parallel to the direction of word lines are formed over the memory cell block region 200. The first photoresist patterns 432 formed in the memory cell block region 200 are extended into the first and the second contact pad regions 100 and 300. The second photoresist patterns 431 each having, for example, a rectangle shape are formed and coupled to the ends of the first photoresist patterns 432.

The first and the second photoresist patterns 432 and 431 formed in the first and the second contact pad regions 100 and 300 are classified into 8 groups G1 to G8. In this disclosure, the 36 photoresist patterns 432 are arranged into 8 groups G1 to G8. The groups G1 to G8 comprise the following numbers of photoresist patterns 432, respectively: 6, 4, 4, 4, 4, 4, 4, and 6. A second photoresist pattern 431 coupled to each of the 36 photoresist patterns 432 in the 8 groups G1 to G8 are classified as one group. The second photoresist patterns 431 corresponding to the first, the second, the fifth, and the sixth groups G1, G2, G5, and G6 are formed in the first contact pad region 100, and the second photoresist patterns 431 corresponding to the third, the fourth, the seventh and the eighth groups G3, G4, G7, and G8 are formed in the second contact pad region 300. The second photoresist patterns 431 formed for the first group G1 extend in an opposite direction than the second photoresist patterns 431 formed for the second group1 G2. Similarly, the second photoresist patterns 431 formed for the fifth group G5 extend in an opposite direction than the second photoresist patterns 431 formed for the sixth group G6. Furthermore, the second photoresist patterns 431 formed for the third group G3 extend in an opposite direction than the second photoresist patterns 431 formed for the fourth group G4. Similarly, the second photoresist patterns 431 formed for the seventh group G7 extend in an opposite direction than the second photoresist patterns 431 formed for the eighth group G8. Furthermore, the photoresist patterns 431 of the second group G2 and the photoresist patterns 431 of the fifth group G5 are arranged so that they do not overlap with each other. Furthermore, the photoresist patterns 431 of the fourth group G4 and the photoresist patterns 431 of the seventh group G7 are arranged so that they do not overlap with each other.

The first photoresist patterns 432 disposed at the outermost of the memory cell block region 200 are patterns for metal lines coupled to a drain select line DSL and a source select line SSL. The first photoresist patterns 432 disposed at the outermost of the memory cell block region 200 may be thicker than the remaining photoresist patterns.

Figure 3:
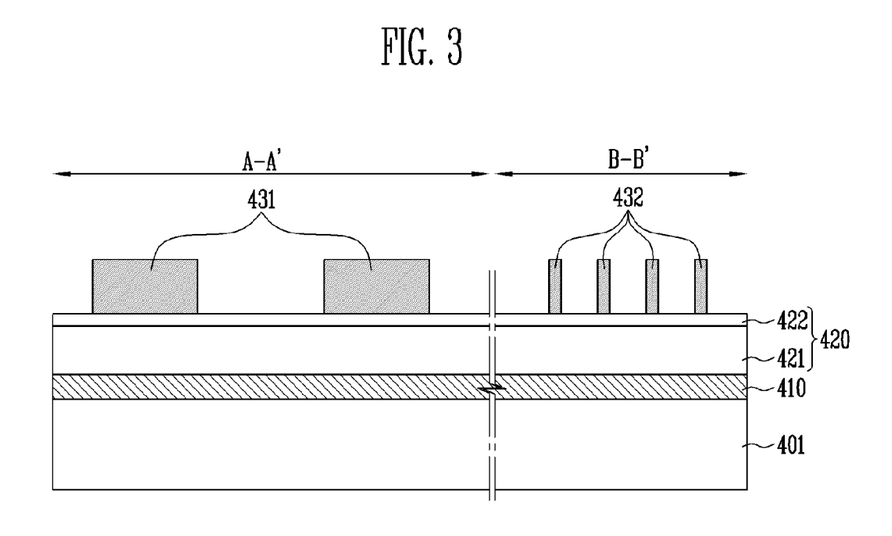

FIG. 3 is a cross-sectional view taken along line A-A' and line B-B' of FIG. 2.

Referring to FIG. 3, a conductive layer 410 for metal lines and a hard mask layer 420 are stacked in the memory cell block region 200 of the semiconductor substrate 401 in which underlying structures, such as the source and drain select lines SSL and DSL, the 2 pass transistor gate lines, and the 64 gate lines, are formed. The hard mask layer 420 may be formed of first and second hard mask layers 421 and 422.

The first photoresist patterns 432 are formed on the hard mask layer 420 formed in line B-B' over the memory cell block region 200, and the second photoresist patterns 431 are formed on the hard mask layer 420 formed in A-A' over the first and the second contact pad region 300.

Figure 4:
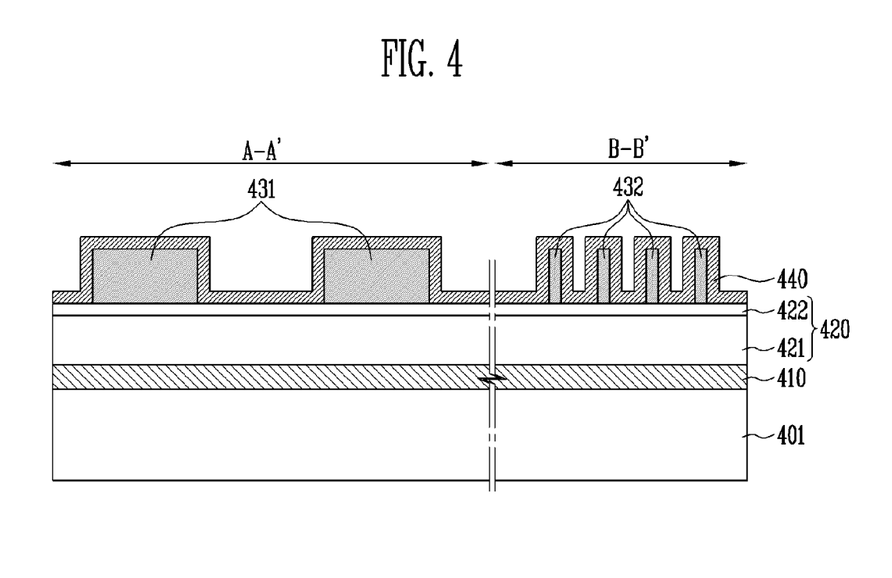

Referring to FIG. 4, a spacer layer 440 is formed on the entire surface of the semiconductor substrate in which the first and the second photoresist patterns 432 and 431 are formed.

Figure 5:
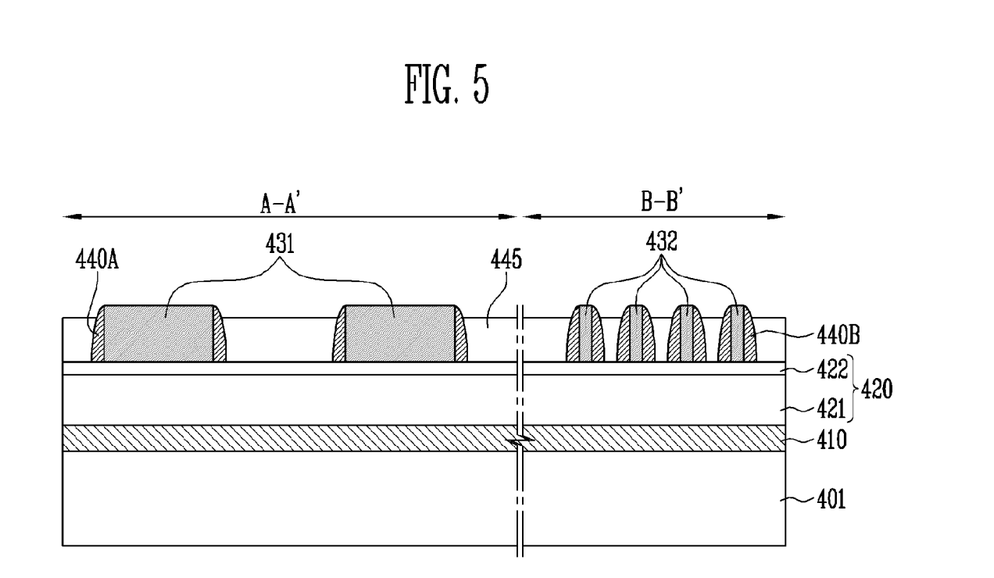

Referring to FIG. 5, first spacers 440A and second spacers 440B are formed by performing a dry etch process so that the spacer layer remains on the sidewalls of the first and the second photoresist patterns 432 and 431. The space between the first spacers 440A and the space between the second spacers 440B is filled with a buffer layer 445.

Figure 6:
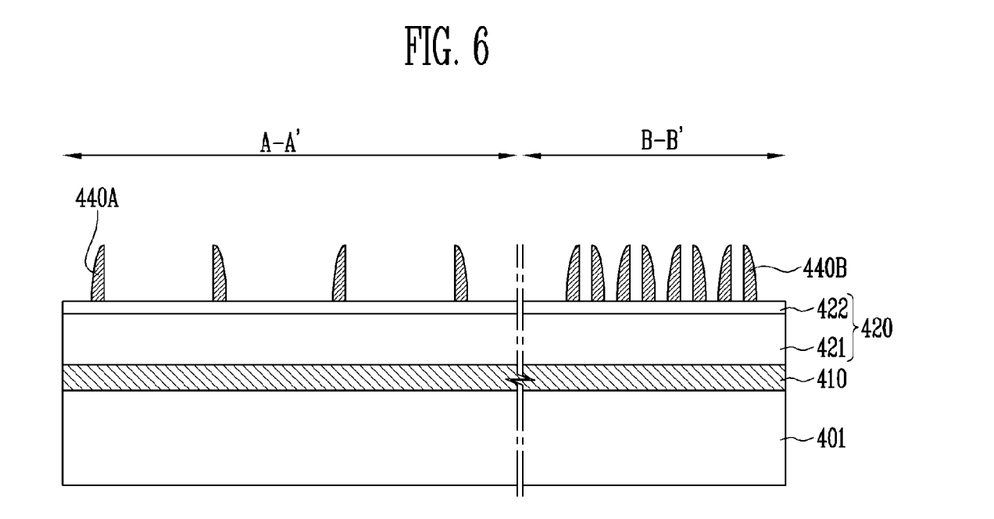
Figure 7:
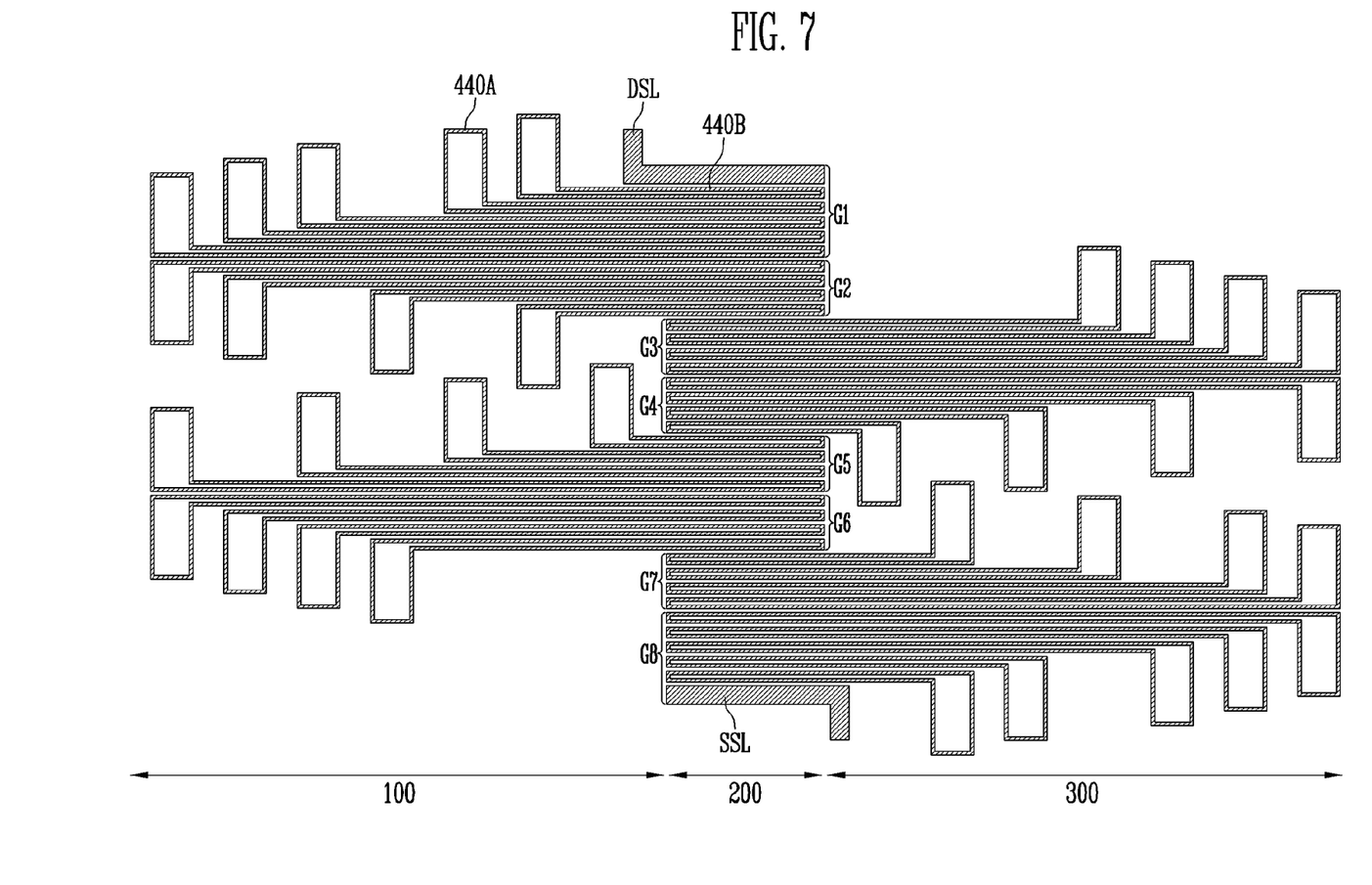

Referring to FIGS. 6 and 7, the first and the second photoresist patterns and the buffer layer are removed by an etch process. The etch process may be such that the photoresist patterns formed in the drain select line and the source select line may not be removed.

The first spacer 440A may be disposed in a vertical direction at the end of the second spacer 440B so that the ends of the first spacers 440A are interconnected.

Figure 8:
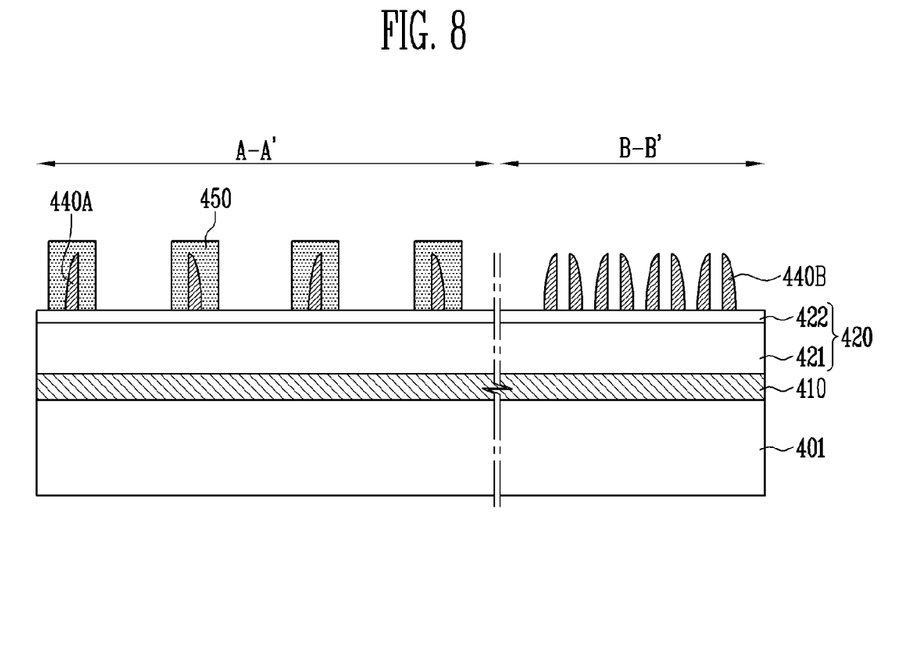
Figure 9:
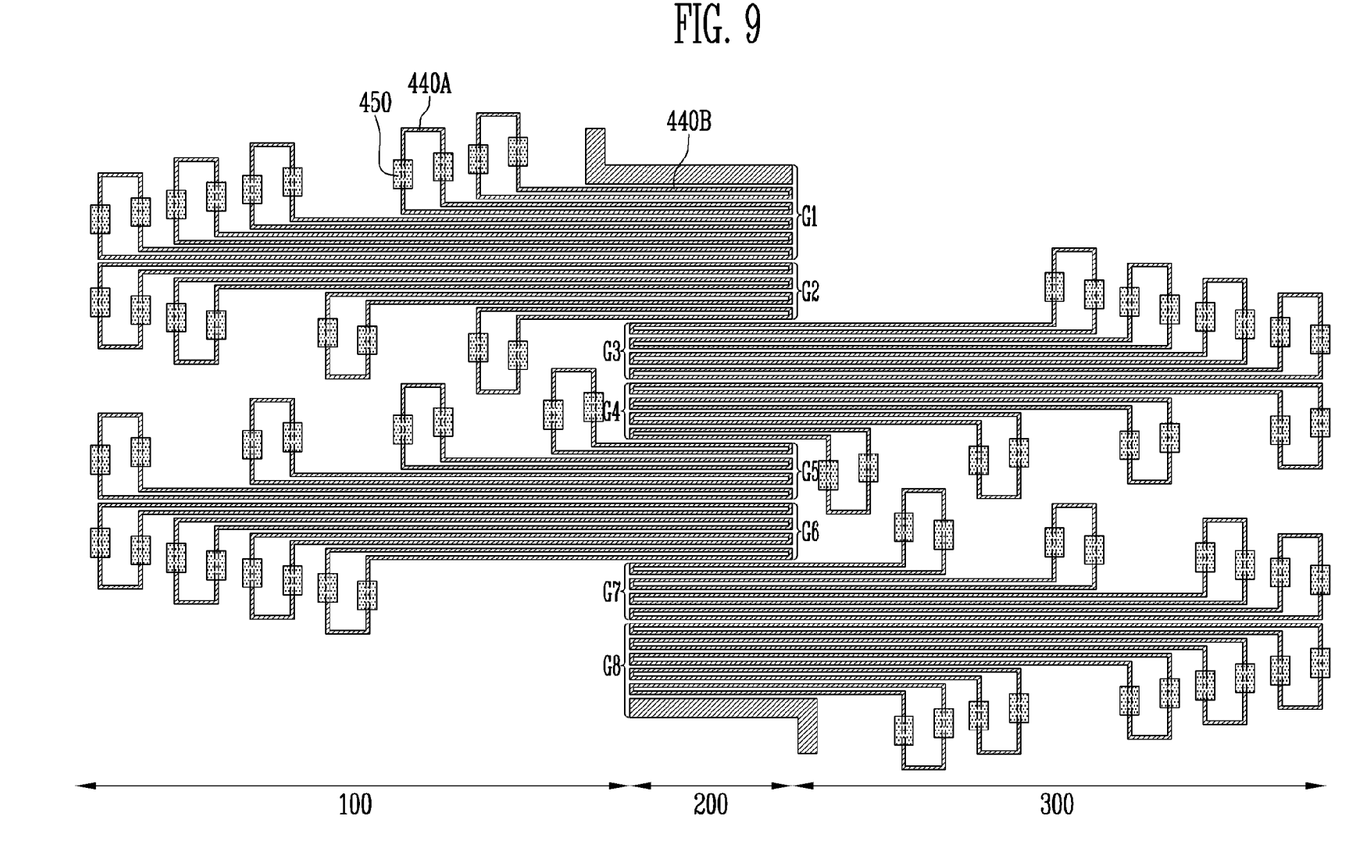

Referring to FIGS. 8 and 9, pad masks 450 are formed to surround the first spacers 440A formed on the first and the second pad regions 100 and 200.

Figure 10:
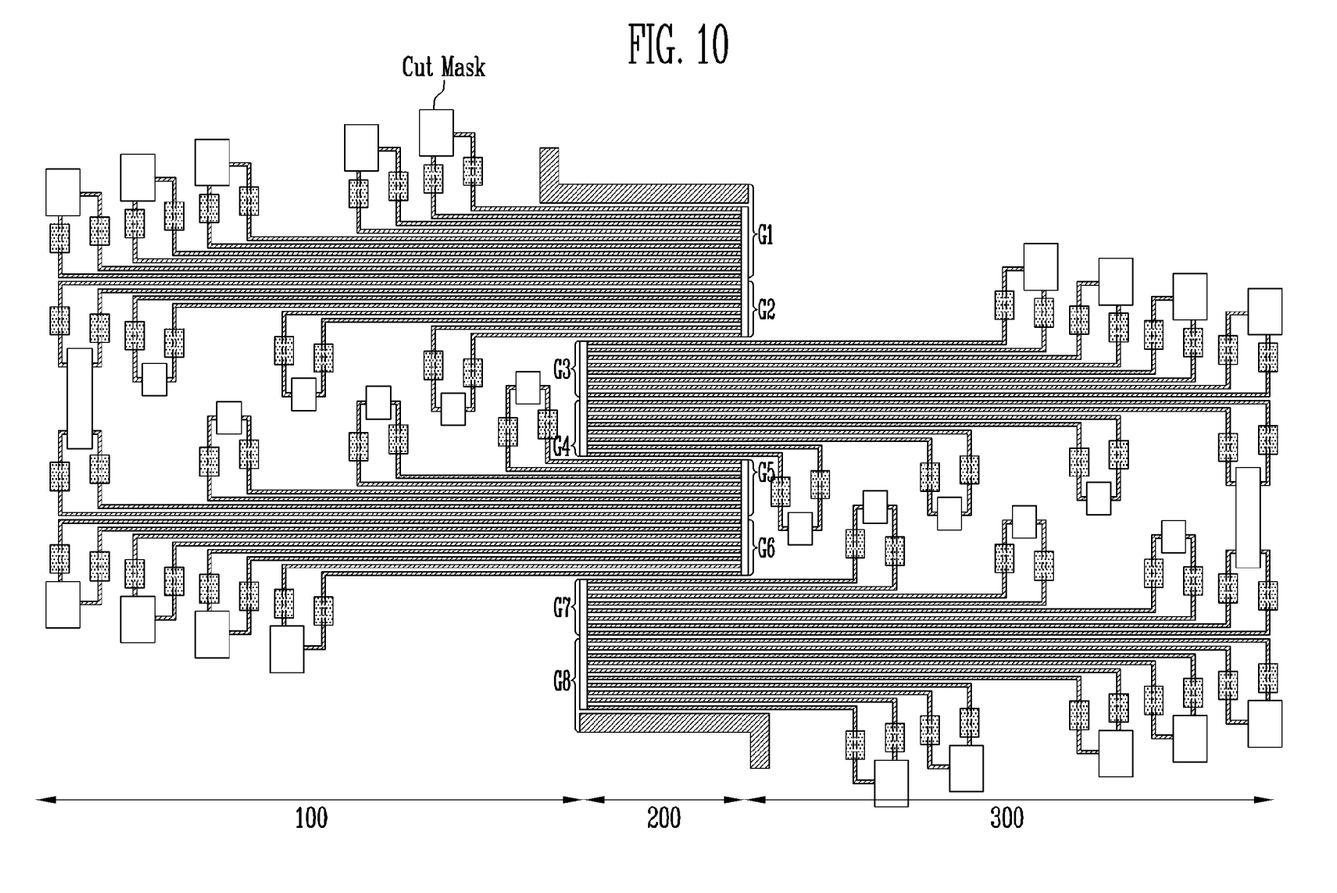

Referring to FIG. 10, an etch process using cut masks is performed to separate the second spacers 432, interconnected within each group, from each other.

Figure 11:
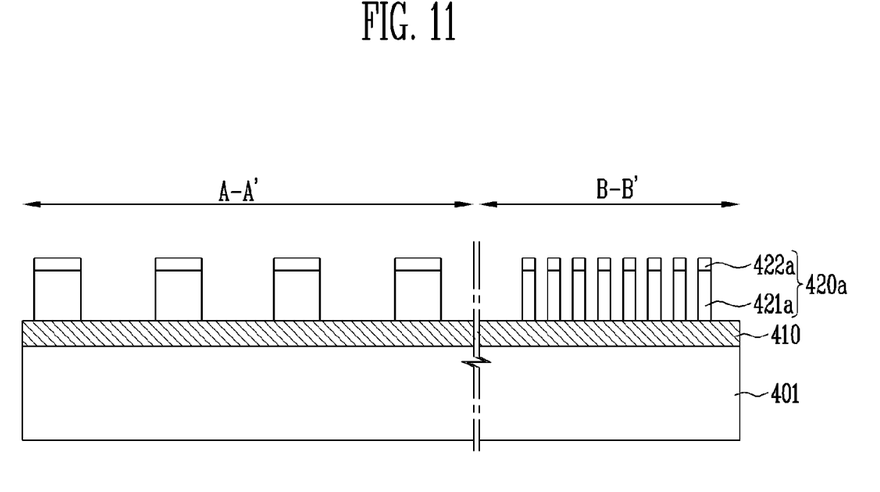

Referring to FIG. 11, hard mask patterns 420a are formed by patterning the first and the second hard mask layers 421a and 422a through an etch process using the first and the second spacers as etch masks.

Figure 12:
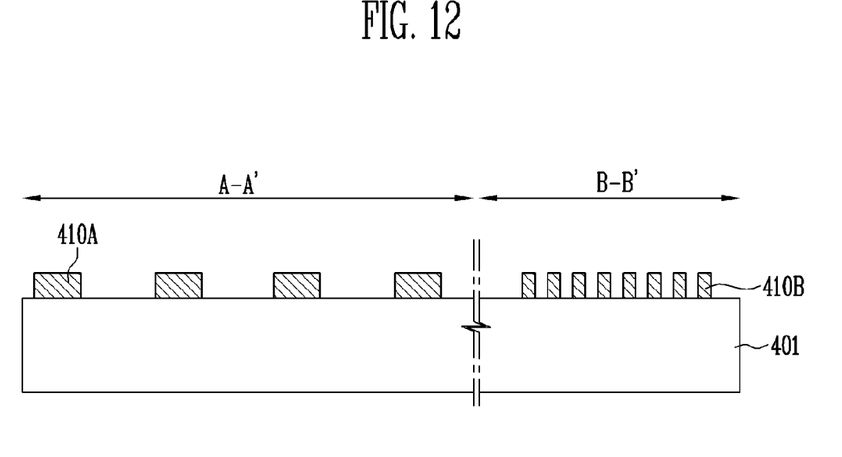

Referring to FIG. 12, a plurality of conductive lines 410B and contact pads 410A coupled to the respective conductive lines are formed by patterning the conductive layer through an etch process using the hard mask patterns.

Figure 13:
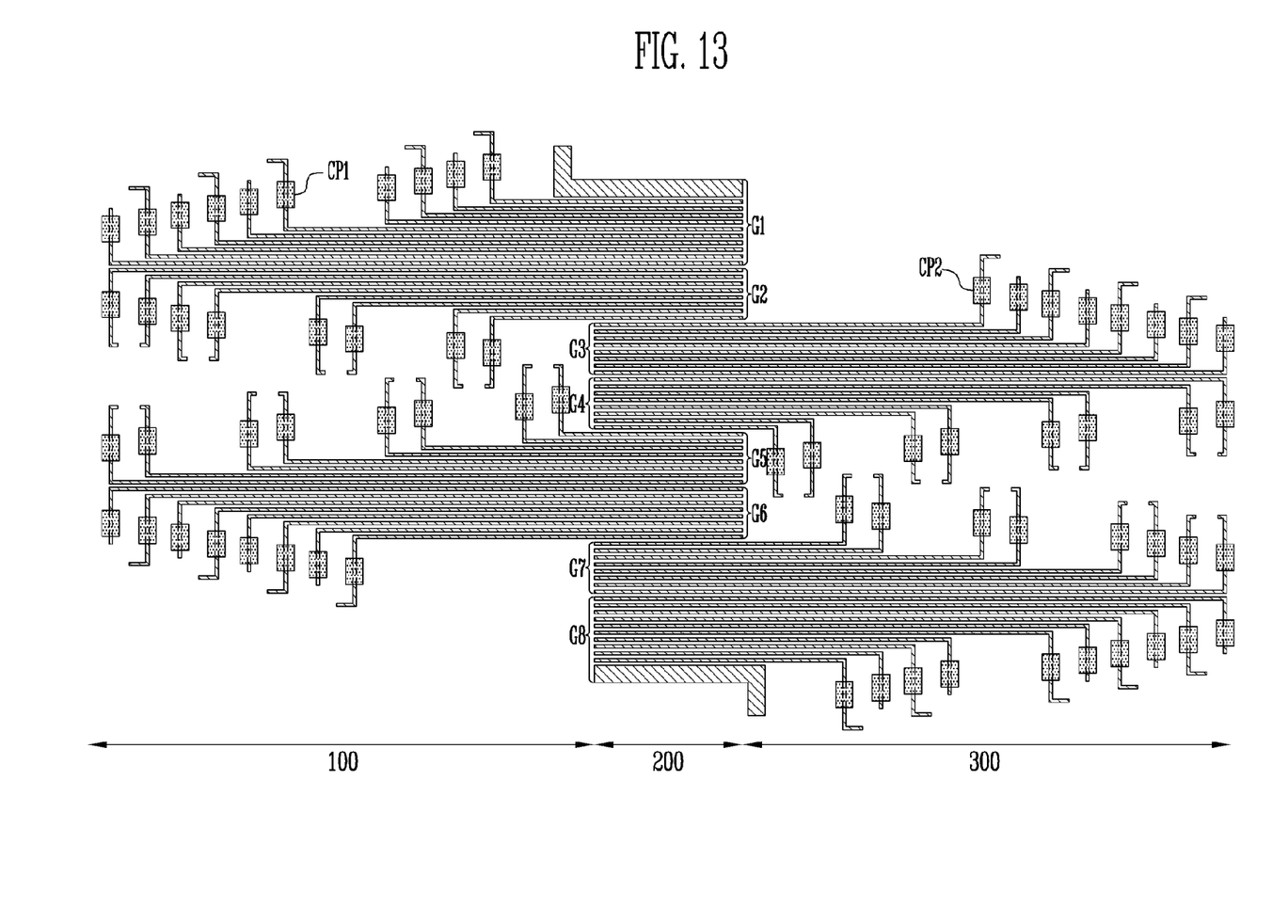

FIG. 13 is a plan view of a semiconductor device according to an embodiment of this disclosure.

Referring to FIG. 13, the semiconductor device includes a plurality of parallel conductive lines 410B formed on a memory cell block region 200. The plurality of parallel conductive lines 410B is defined to be 8 conductive line groups G1 to G8 according to the order of arrangement. In this disclosure, an example where 2 select lines (source and drain select lines), 2 pass transistor gate lines, and 64 cell gate lines are formed is described. Accordingly, a total of the 68 parallel conductive lines 410B are formed. Each of the first and the eighth conductive line groups, disposed on the regions where the respective select lines and the respective pass transistor gate lines are formed, include the 10 conductive lines 410B, and each of the remaining second to seventh conductive line groups includes the 8 conductive lines 410B.

That is, the first conductive line group G1 includes a plurality of first conductive lines. The second conductive line group G2 includes a plurality of second conductive lines. The third conductive line group G3 includes a plurality of third conductive lines. The fourth conductive line group G4 includes a plurality of fourth conductive lines. The fifth conductive line group G5 includes a plurality of fifth conductive lines. The sixth conductive line group G6 includes a plurality of sixth conductive lines. The seventh conductive line group G7 includes a plurality of seventh conductive lines. The eighth conductive line group G8 includes a plurality of eighth conductive lines.

Furthermore, the conductive lines of the first, the second, the fifth, and the sixth conductive line groups G1, G2, G5, and G6 are extended into the first contact pad region 100 disposed on one side of the memory cell block region 200. The conductive lines of the third, the fourth, the seventh, and the eighth conductive line groups G3, G4, G7, and G8 are extended into the second contact pad region 300 disposed on the other side of the memory cell block region 200.

Furthermore, the ends of the conductive lines of the first to eighth conductive line groups G1 to G8 extended into the first contact pad region 100 and the second contact pad region 200 are formed so that they extend perpendicularly. The conductive lines of the first conductive line group G1 and the conductive lines of the second conductive line group G2, extended into the first contact pad region 100, are bent and extended in opposite directions so that they do not overlap with each other. The conductive lines of the fifth conductive line group G5 and the conductive lines of the sixth conductive line group G6 are bent and extended in opposite directions so that they do not overlap with each other. Furthermore, the conductive lines of the third conductive line group G3 and the conductive lines of the fourth conductive line group G4, extended into the second contact pad region 300, are bent and extended in opposite directions so that they do not overlap with each other. The conductive lines of the seventh conductive line group G7 and the conductive lines of the eighth conductive line group G8 are bent and extended in opposite directions so that they do not overlap with each other.

Furthermore, the contact pads are coupled to the respective ends of the conductive lines of each group. That is, the first contact pads CP1 are coupled to the ends of the conductive lines of the first, the second, the fifth, and the sixth conductive line groups G1, G2, G5, and G6. The second contact pads CP2 are coupled to the respective ends of the conductive lines of the third, the fourth, the seventh, and the eighth conductive line groups G3, G4, G7, and G8.

Furthermore, the contact pads of one group forms pairs each by twos are arranged with the contact pad pairs of the other group facing the one group so that the contact pads coupled to the ends of the conductive lines of the second conductive line group G2 and the conductive lines of the fifth conductive line group G5, bent and extended in a direction where they face each other, do not overlap with each other.

Furthermore, the contact pads of one group forms pairs each by twos are arranged with the contact pad pairs of the other group facing the one group so that the contact pads coupled to the ends of the conductive lines of the fourth conductive line group G4 and the conductive lines of the seventh conductive line group G7, bent and extended in a direction where they face each other, do not overlap with each other.

As described above, the semiconductor device of this disclosure includes the contact pad regions extended into both sides of the memory cell block region, and the conductive lines are divided into the two contact pad regions and then extended. Accordingly, the area where the contact pads are disposed can be secured. Furthermore, the conductive line groups adjacent to each other are bent in opposite directions, the contact pads are formed in the conductive line groups, and the contact pads are alternately arranged in groups facing each other. Accordingly, the area occupied by the contact pads can be reduced because the arrangement of the contact pads is optimized.

The first and second contact pads CP1 and CP2 formed in the first and the second contact pad regions 100 and 300 are contact pads to be coupled to the pass transistors of an X decoder which is formed in the peripheral region 400 of FIG. 1.

In this disclosure, although the example where the conductive lines are classified into the 8 groups has been described, the conductive lines may be classified into 16 groups by taking the size of the contact pad into consideration. In this case, the area occupied by the contact pads can be further reduced if the contact pads are arranged as described above.

According to various embodiments of the invention, a plurality of conductive lines is classified into a plurality of groups, adjacent groups are extended in opposite directions and coupled to contact pads, and the contact pads of groups facing each other are arranged to avoid overlapping. Accordingly, the area occupied by the contact pads can be reduced because the degree of integration of the contact pads is increased. The number of groups need not be limited to those specified in the descriptions above.

What is claimed:

1. A semiconductor device, comprising:
   first to fourth conductive line groups arranged in parallel over one memory cell block and each configured to include conductive lines;
   first contact pads coupled to respective ends of the conductive lines of the first and third conductive line groups in a first direction; and
   second contact pads coupled to respective ends of the conductive lines of the second and fourth conductive line groups in a second direction opposite to the first direction,
   wherein odd-numbered conductive line groups of the first to fourth conductive line groups are extended in the first direction, and
   even-numbered conductive line groups of the first to fourth conductive line groups are extended in the second direction.

2. The semiconductor device of claim 1, wherein the first contact pads and the second contact pads are coupled to an X decoder disposed in a peripheral region.

3. The semiconductor device of claim 1, wherein:
   the odd-numbered conductive line groups of the first to fourth conductive line groups are extended into a first contact pad region disposed in the first direction of the memory cell block region, and
   the even-numbered conductive line groups of the first to fourth conductive line groups are extended into a second contact pad region disposed in the second direction of the memory cell block region.

4. The semiconductor device of claim 1, wherein end portions of the conductive lines of the first to fourth conductive line groups are perpendicularly extended with respect to the non-end portions.

5. The semiconductor device of claim 1, wherein the conductive lines are gate lines of a memory cell block.

6. A semiconductor device, comprising:
   first to eighth conductive line groups arranged in parallel over one memory cell block and each configured to include conductive lines;
   first contact pads coupled to respective ends of first, second, fifth, and sixth conductive lines, respectively corresponding to the first, the second, the fifth, and the sixth conductive line groups, in a first direction; and
   second contact pads coupled to respective ends of third, fourth, seventh, and eighth conductive lines, respectively corresponding to the third, the fourth, the seventh, and the eighth conductive line groups, in a second direction opposite to the first direction.

7. The semiconductor device of claim 6, wherein:
   the first, the second, the fifth, and the sixth conductive lines of the first, the second, the fifth, and the sixth conductive line groups are extended into a first contact pad region disposed in the first direction of the memory cell block region, and the third, the fourth, the seventh, and the eighth conductive lines of the third, the fourth, the seventh, and the eighth conductive line groups are extended into a second contact pad region disposed in the second direction of the memory cell block region.

8. The semiconductor device of claim 7, wherein end portions of the first, the second, the fifth, and the sixth conductive lines of the first, the second, the fifth, and the sixth conductive line group extended into the first contact pad region are perpendicularly extended with respect to the non-end portions.

9. The semiconductor device of claim 8, wherein:
the end portions of the first conductive lines of the first conductive line group and the end portions of the second conductive lines of the second conductive line group are extended in opposite directions so that the first conductive lines and the second conductive lines do not overlap with each other, and
the end portions of the fifth conductive lines of the fifth conductive line group and the end portions of the sixth conductive lines of the sixth conductive line group are extended in opposite directions so that the fifth conductive lines and the sixth conductive lines do not overlap with each other.

10. The semiconductor device of claim 8, wherein:
the first contact pads coupled to the ends of the second conductive lines of the second conductive line group and the fifth conductive lines of the fifth conductive line group, extended in a direction where the second conductive lines and the fifth conductive lines face each other, form pairs each by the two first contact pads adjacent to each other within an identical group, and
the pair of first contact pads coupled to the second conductive line group is arranged so that the pair of first contact pads does not overlap with the pair of second contact pads coupled to the fifth conductive line group.

11. The semiconductor device of claim 7, wherein end portions of the third, the fourth, the seventh, and the eighth conductive lines of the third, the fourth, the seventh, and the eighth conductive line groups extended into the second contact pad region are perpendicularly extended with respect to the non-end portions.

12. The semiconductor device of claim 11, wherein:
the end portions of the third conductive lines of the third conductive line group and the end portions of the fourth conductive lines of the fourth conductive line group are extended in opposite directions so that the third conductive lines and the fourth conductive lines do not overlap with each other, and
the end portions of the seventh conductive lines of the seventh conductive line group and the end portions of the eighth conductive lines of the eighth conductive line group are extended in opposite directions so that the seventh conductive lines and the eighth conductive lines do not overlap with each other.

13. The semiconductor device of claim 11, wherein:
the second contact pads coupled to the ends of the fourth conductive lines of the fourth conductive line group and the seventh conductive lines of the seventh conductive line group, extended in a direction where the fourth conductive lines and the seventh conductive lines face each other, form pairs each by the two second contact pads adjacent to each other within an identical group, and
the pair of second contact pads coupled to the fourth conductive line group is arranged so that the pair of second contact pads does not overlap with the pair of second contact pads coupled to the seventh conductive line group.

14. A semiconductor device, comprising:
first, second, fifth, and sixth conductive line groups formed over one memory cell block region and over a first contact pad region on one side of the memory cell block region;
third, fourth, seventh, and eighth conductive line groups formed over the memory cell block region and over a second contact pad region on the other side of the memory cell block region;
first contact pads coupled to respective ends of first, second, fifth, and sixth conductive lines, included in the first, the second, the fifth, and the sixth conductive line groups, over the first contact pad region; and
second contact pads coupled to respective ends of third, fourth, seventh, and eighth conductive lines, included in the third, the fourth, the seventh, and the eighth conductive line groups, over the second contact pad region,
wherein the first, the second, the fifth, and the sixth conductive lines and the third, the fourth, the seventh, and the eighth conductive lines are extended and arranged in opposite directions to adjacent conductive line groups and the first to eighth conductive lines of the first to eighth conductive line groups are extended and arranged in opposite directions to adjacent conductive line groups so that the first contact pads do not overlap with each other and the second contact pads do not overlap with each other.

15. The semiconductor device of claim 14, wherein end portions of the first, the second, the fifth, and the sixth conductive lines of the first, the second, the fifth, and the sixth conductive line group in the first contact pad region are perpendicularly extended with respect to the non-end portions.

16. The semiconductor device of claim 15, wherein:
the end portions of the first conductive lines of the first conductive line group and the second conductive lines of the end portions of the second conductive line group are extended in opposite directions so that the first conductive lines and the second conductive lines do not overlap with each other, and
the end portions of the fifth conductive lines of the fifth conductive line group and the end portions of the sixth conductive lines of the sixth conductive line group are extended in opposite directions so that the fifth conductive lines and the sixth conductive lines do not overlap with each other.

17. The semiconductor device of claim 15, wherein:
the first contact pads coupled to the ends of the second conductive lines of the second conductive line group and the fifth conductive lines of the fifth conductive line group, extended in a direction where the second conductive lines and the fifth conductive lines face each other, form pairs each by the two first contact pads adjacent to each other within an identical group, and
the pair of first contact pads coupled to the second conductive line group is arranged so that the pair of first contact pads does not overlap with the pair of second contact pads coupled to the fifth conductive line group.

18. The semiconductor device of claim 14, wherein end portions of the third, the fourth, the seventh, and the eighth conductive lines of the third, the fourth, the seventh, and the eighth conductive line groups in the second contact pad region are perpendicularly extended with respect to the non-end portions.

19. The semiconductor device of claim 18, wherein:

the end portions of the third conductive lines of the third conductive line group and the end portions of the fourth conductive lines of the fourth conductive line group are extended in opposite directions so that the third conductive lines and the fourth conductive lines do not overlap with each other, and the end portions of the seventh conductive lines of the seventh conductive line group and the end portions of the eighth conductive lines of the eighth conductive line group are extended in opposite directions so that the seventh conductive lines and the eighth conductive lines do not overlap with each other.

20. The semiconductor device of claim 18, wherein:

the second contact pads coupled to the ends of the fourth conductive lines of the fourth conductive line group and the seventh conductive lines of the seventh conductive line group, extended in a direction where the fourth conductive lines and the seventh conductive lines face each other, form pairs each by the two second contact pads adjacent to each other within an identical group, and the pair of second contact pads coupled to the fourth conductive line group is arranged so that the pair of second contact pads does not overlap with the pair of second contact pads coupled to the seventh conductive line group.

\* \* \* \* \*